United States Patent [19]

Patrick

[11] Patent Number: 5,354,706
[45] Date of Patent: Oct. 11, 1994

[54] FORMATION OF UNIFORM DIMENSION CONDUCTIVE LINES ON A SEMICONDUCTOR WAFER

[75] Inventor: Roger Patrick, Santa Clara, Calif.

[73] Assignee: LSI Logic Corporation, Milpitas, Calif.

[21] Appl. No.: 25,201

[22] Filed: Mar. 2, 1993

[51] Int. Cl.⁵ ............................................. H01L 21/76
[52] U.S. Cl. .................................. 437/67; 437/228; 257/305
[58] Field of Search .............. 437/68, 67, 228, 186; 148/DIG. 50; 257/305

[56] References Cited

U.S. PATENT DOCUMENTS

| | | | |
|---|---|---|---|
| 4,473,598 | 9/1984 | Ephrath et al. | 427/86 |
| 4,534,826 | 8/1985 | Goth et al. | 156/643 |
| 4,980,311 | 12/1990 | Namose | 437/67 |
| 5,011,788 | 4/1991 | Kawaji et al. | 437/67 |
| 5,055,871 | 10/1991 | Pasch | 355/53 |
| 5,244,827 | 9/1993 | Dixit et al. | 437/70 |

FOREIGN PATENT DOCUMENTS

| | | |
|---|---|---|
| 0113517 | 7/1984 | European Pat. Off. . |
| 0375632 | 6/1990 | European Pat. Off. . |
| 59-108325A | 6/1984 | Japan . |
| 62-018719 | 1/1987 | Japan ............... 437/67 |
| 62-125629A | 6/1987 | Japan . |
| 01143231 | 6/1989 | Japan ............... 437/67 |
| 1-235245A | 9/1989 | Japan ............... 21/76 |
| 3151635A | 11/1989 | Japan ............... 21/302 |

Primary Examiner—Olik Chaudhuri
Assistant Examiner—Ken Horton
Attorney, Agent, or Firm—Gerald E. Linden

[57] ABSTRACT

A method for forming uniformly sized features, such as polysilicon lines or gates, or such as conductive lines, on a semi conductor wafer having a planar upper surface is described which minimizes variations in the critical dimensions of the features. The technique allows a substantially uniform overlying layer, such as photoresist, to be formed above the layer intended to contain the features. The method can be applied to forming isolation trenches around active areas on the semiconductor wafer, overfilling the trenches with an insulating material (e.g., oxide), polishing back the oxide to a planar surface, depositing a planar layer of a conductive material (e.g., poly), and depositing a planar layer of a photoresist. The planar layer of photoresist, being deposited over a planar layer of conductive material has substantially uniform thickness and correspondingly uniform reflectivity. As a result, conductive lines formed by photolithographic processing of the underlying conductive material are substantially uniform in both width and thickness.

20 Claims, 3 Drawing Sheets

FORMATION OF UNIFORM DIMENSION CONDUCTIVE LINES ON A SEMICONDUCTOR WAFER

TECHNICAL FIELD OF THE INVENTION

The invention relates to the fabrication of integrated (IC) semiconductor devices, and more particularly to the formation of uniformly-sized features, especially polysilicon lines, on a semiconductor die.

BACKGROUND OF THE INVENTION

Photolithography is a common technique employed in the manufacture of semiconductor devices. Typically, a semiconductor wafer is coated with a layer (film) of photo-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern of lines on the mask.

This is all good in theory, until one recognizes that the uniformity of the illuminating light varies, typically at the source of the light, and that such non-uniformity will manifest itself as variations in the size of features (e.g., photoresist lines) that can be created on the wafer. To the end of uniformizing the light incident on and passing through the mask, various techniques have been proposed among these as technique discussed in commonly-owned U.S. Pat. No. 5,055,871 (Pasch).

The ultimate goal of uniformizing (homogenizing) the incident light is that the illumination uniformity (i.e., non-uniformity) of photolithographic apparatus will often set a limit to how small a feature, such as a line, can be imaged in a manufacturing environment. And, as a general principle, being able to create smaller integrated circuit features is better (faster, more compact, etc.).

Of no less concern than the ultimate size (smallness) of features, is the ability to control the critical dimension ("cd") from one feature to another. For example, since size generally equates with speed (e.g., smaller is generally faster), it is disadvantageous to have one feature, such as a polysilicon ("poly") gate, smaller (and faster) than another poly gate on the same device. Conversely, it is highly desirable to fabricate all similar features (e.g., poly gates) to be the same size (i.e., with the same "cd"), especially in gate-array or cell type devices, and combinations thereof, such as Application Specific Integrated Circuits (ASICs), including ASICs with on-chip memory.

In addition to non-uniform illumination, another cause of variation in "cd" is non-uniformity of the thickness of films overlying an irregular topography on the wafer surface. Prior to the numerous steps involved in fabricating integrated circuit devices on a semiconductor wafer, the wafer is initially fairly flat—exhibiting a relatively regular topography. However, prior structure formation often leaves the top surface topography of the silicon wafer highly irregular, with bumps, areas of unequal elevations, troughs, trenches and/or other surface irregularities. As a result of these irregularities, deposition of subsequent layers of materials could easily result in incomplete coverage, breaks in the deposited material, voids, etc., if it were deposited directly over the aforementioned highly irregular surfaces. If the irregularities are not alleviated at each major processing step, the top surface topography of the surface irregularities will tend to become even more irregular, causing further problems as layers stack up in further processing of the semiconductor structure.

As mentioned above, the application and patterning of photoresist is typically a key step in the fabrication of complex integrated circuit devices, and is a procedure that may be repeated at several different stages throughout the fabrication process.

It has been noticed, and is generally known, that the thickness of a subsequently applied film, particularly a layer of photoresist, will vary (in a generally non-predictable manner) depending upon the irregular topography of the underlying surface. For example, a photoresist layer, even if spun-on, will exhibit a different thickness, from point-to-point over the wafer (and within the area of a given device), depending on the irregular topography of underlying features.

This variation in the thickness of photoresist over an irregular topography is graphically illustrated in FIG. 1a.

FIG. 1A shows a portion of a semiconductor wafer 110 which has been processed to develop raised structures 112a, 112b and 112c of Field Oxide (FOX), between which are active areas (islands) 114a and 114b having a lower elevation (e.g., at wafer level). The island 114a between the FOX structures 112a and 112b has a width w1 substantially smaller than the width w2 of the island 114b between the FOX structures 112b and 112c. Having islands of different widths is not uncommon. For example, the island 114a may be an "array island" having a width w1 on the order of 3 microns, and the island 114b may be an "I/O (Input/Output) island" having a width w2 on the order of hundreds of microns. Both types of islands are usually required for an integrated circuit device, and it is not uncommon to have widely varying island sizes in a single device. In any case, the island areas are usually lower (less elevated) than the field oxide (FOX) areas.

An overlying layer 120 of polysilicon ("poly") is deposited over the wafer, which already exhibits an irregular topography. This is according to known techniques and is presented by way of example only.

An overlying film (layer) 130 of photoresist is applied, in any suitable manner, over the poly layer 120, and photolithographically treated to created etch-resistant "lines" (photochemically-converted areas) 132 and 134 over the active areas 114a and 114b, respectively. The line features 132 and 134 are shown in reverse cross-hatch from the remainder of the film 130.

Ultimately, the photoresist layer 130 is etched (or washed) away, leaving only a pattern of photochemically-converted areas 132 and 134 overlying the poly 120. In subsequent fabrication steps, the wafer is etched (chemical, plasma, etc.), so that all but discrete poly regions 122 and 124 (shown in reverse cross-hatch) underlying respective photoresist features 132 and 134, respectively, are removed from the surface of the wafer. With additional processing, not shown, the poly regions 122 and 124 may perform as gates.

Since electron flow in the lateral direction (i.e., plane of the wafer) is of primary concern in the performance of circuit elements (e.g., poly gates), the transverse dimension of the poly gates 122 and 124 parallel to the plane of the wafer is of paramount interest. For purposes of this discussion, this transverse dimension is termed a "critical dimension", or "cd." The poly gate 122 has a first cd, designated "cd1", and the poly gate 124 has a second cd, different from the first cd, designated "cd2".

In essence, the cd's of the two poly gates are different, because the width of the respective overlying photoresist features is different. (Generally, the width of a poly gate will be essentially the same as that of the overlying resist feature.)

As mentioned above, it is nearly impossible to apply a uniform layer of photoresist over an irregular surface. Hence, the thickness of the photoresist 130 over the active area 114a (particularly over the area where the poly gate 122 is to be formed) is different (shown thicker) than the thickness of the photoresist 130 over the active area 114b (particularly where the poly gate 124 is to be formed).

It is also generally known, that the reflectance of a film (such as photoresist) will vary with its thickness. Hence, since the thickness of an overlying film at any given point on the surface of the semiconductor wafer (e.g., photoresist) is not uniform, the reflectance is consequently non-uniform from point-to-point across the surface of the wafer.

This indeterminate nature of resist (Photoresist) thickness and reflectivity over irregular underlying surfaces has important, negative ramifications in the semiconductor fabrication process, especially in the process of fabricating circuit elements having "critical dimensions".

FIG. 1B illustrates the reflectivity problem, and its manifestation in the size of a photoresist feature. Here, in a photolithographic process, a film 140 of photoresist is exposed to light (arrows ↓ ↓ ↓ ↓) of hypothetically uniform intensity. A mask 150 is interposed in the light path, and is provided with light-transmitting area (lines) 152 and 154 allowing light (↓ ↓) to impinge upon selected areas 142 and 144, respectively, of the film 140.

In FIG. 1b, the thickness of the film 140 is intentionally shown to be different in the areas 142 and 144. And, as will be seen, it is relatively insignificant that the film is thicker in the area 144 than in the area 142. For purposes of this discussion, depth of field (depth of focus) issues that may arise from projecting a mask image onto a surface of varying height may be ignored.

FIG. 1C illustrates graphically the effect of film thickness (horizontal axis) on reflectivity (i.e., the energy reflected by the film), and relates to the issues raised in FIG. 1b. While there is a general increase in reflectivity with increased thickness, there is a much more profound (generally sinusoidal) pattern of "maxima" 170a, 170b and 170c and "minima" 172a, 172b and 172c, which exhibits that the reflectivity for a given film thickness (point 172c) can well be LESS than the reflectivity for a given lesser film thickness (point 170b). (Dashed horizontal line 174 is provided as a visual aid.) Importantly, these variations are dependent on relatively small, e.g., a quarter of a wavelength, variations in the thickness of the film—difficult dimensions to measure, let alone control.

Returning to FIG. 1b, it can be appreciated that it is rather indeterminate how much of the (supposedly uniform) incident energy (↓ ↓ ↓) will be absorbed by the photoresist film, and how much will be reflected, at any given point. And, as a general proposition, the more incident energy (↓ ↓ ↓) that is absorbed at a given point, the greater the area of the given feature 142 or 144 will "grow". Of course, the reverse would be true for reverse masking, wherein light acts outside of the desired feature, in which case the more light absorbed—the smaller the feature would be.

In any case, the point is made that an irregular thickness of an overlying film (e.g., photoresist) will impact upon the ultimate critical dimension (cd) of underlying features (e.g., poly gate) being formed, with commensurate undesirable functional effects.

Certainly, if reflectively issues were ignored, which they cannot be, the widths of all of the photoresist lines and underlying features would be well-controlled. However, because the photoresist thickness varies from point-to-point over the wafer, and consequently its reflectivity varies from point-to-point, the efficiency of the incident light on the photoresist layer will vary commensurately, which will affect the ultimate width of the resist features.

Evidently, the efficiency of the photolithography process is dependent on the ability of the photoresist material to absorb the radiant energy (light), and this ability is, in turn, affected by the thickness/reflectance of the photoresist.

In the prior art, it has been known to compensate approximately for known variations (and to some extent, gross trends can be predicted) photoresist thicknesses by "differentially biasing" the (photomask) line widths in the high versus low reflectivity areas. And FIG. 1c illustrates that, to some extent, one can reasonable assume that the average reflectivity for an area with greater film thickness will reflect more than an area of lesser thickness. This concept maybe employed with respect to relatively large Input/Output (I/O) areas (e.g., 114b versus relatively small active area (e.g., 114a).

And, as mentioned before, in the prior art, it has also been known to use "spin-on" or other techniques in an attempt to apply a film (e.g., photoresist) having a relatively planar top surface. Of course, a relatively planar top surface is of little help, and may in fact be antithetical, in uniformizing the thickness of a film over an underlying surface having an irregular topography—in which case the thickness of the film would vary widely from point-to-point. In such a case, a more "conformal" layer, in other words one exhibiting uniform thickness (not necessarily planar), would be more advantageous and appropriate.

It has also been known to reduce the viscosity of the photoresist so that it goes on in a more planar manner. But, thickness will vary according to the topography of the underlying surface. Further, changing the photoresist chemistry (viscosity) can have adverse side effects, such as poor photolithography resolution.

In the prior art, it has also been known to perform subsequent steps to planarize the photoresist, which can be somewhat effective in overcoming the reflectance issues set forth above—again, so long as the photoresist is planarized over a relatively planar underlying surface.

Prior art techniques for accommodating "cd" variations due to photoresist thickness variations are relatively difficult and time consuming to implement, and may not deliver the desired results.

The following U.S. Pat. Nos. incorporated by reference herein, are cited of general interest: 4,977,330; 4,929,992; 4,912,022; 4,906,852; 4,762,396; 4,698,128; 4,672,023; 4,665,007; 4,541,169; 4,506,434; 4,402,128; 4,541,166; 4,983,251; 5,149,663; 4,764,480; 4,155,802; 3,996,077; 5,116,768; 4,640,000; 3,748,187; 4,973,562; and 4,778,775.

DISCLOSURE OF THE INVENTION

It is therefore an object of the present invention to provide a technique for depositing photoresist on a semiconductor wafer to a uniform thickness.

It is a further object of the present invention to provide a technique for minimizing variance in the reflectivity of a deposited photoresist layer.

It is a further object of the present invention to provide an improved photolithographic technique for forming conductive lines (traces) of substantially uniform width (cd) on a semiconductor wafer.

It is a further object of the present invention to provide an improved photolithographic technique for forming conductive lines (traces) of uniform thickness (height) on a semiconductor wafer.

It is a further object of the present invention to provide an improved technique for forming conductive polysilicon traces on a semiconductor wafer.

It is a further object of the present invention to provide a technique for forming uniformly sized polysilicon gate structures on a MOS integrated circuit.

According to the invention, uniformly sized conductive lines may be formed, in part, by using planar trench isolation techniques in place of more conventional non-planar isolation techniques (e.g., LOCOS Local Oxidation of Silicon, a method of forming thermally grown oxide). The inventive technique is accomplished by defining active areas on an upper surface of a semiconductor wafer, forming trenches around the active areas, overfilling the trenches with an insulating material such that the trenches are completely filled and the entire upper surface of the wafer is covered with the insulating material, polishing back the insulating material until a substantially planar upper surface of the insulating material is formed, disposing a substantially planar layer of a conductive material (e.g., polysilicon) over the substantially planar upper surface of the insulating material, and disposing a substantially planar film of photoresist over the conductive material.

By forming planar layer upon planar layer in this fashion, layers of conductive material and photoresist are formed which are effectively constant (uniform) in thickness over the entire surface of the wafer. As a result, the photoresist layer has effectively uniform reflectivity, for reasons described hereinabove with respect to FIGS. 1b and 1c.

Once the photoresist layer (film) is deposited over the conductive material, a photolithographic treatment of the layer of photoresist is used to form a pattern of photo-chemically converted, etch-resistant areas within the photoresist. The unconverted areas of the photoresist are removed (by etching or washing) leaving only the etch-resistant areas over the conductive materials. A subsequent etching process (e.g., chemical, plasma, etc.) removes the conductive material not covered by the photoresist, leaving conductive areas ("lines") behind.

Because of the uniform reflectivity and thickness of the photoresist layer, the etch-resistant areas formed therewithin are essentially uniformly sized. Accordingly, the features (e.g., polysilicon lines) formed in the layer underlying the photoresist are consequently substantially uniformly sized. The height of these underlying features will be substantially uniform because of the planar form of the deposited conductive layer from which they were formed. The width of these features will be substantially uniform because of the dimensional uniformity of the overlying etch-resistant areas of photoresist.

According to an aspect of the invention, the insulating material may be polished back such that the trenches are filled to a level substantially flush with the upper surface of the wafer.

Alternatively, according to another aspect of the invention, the insulating material may be polished back to a planar surface at a level above the upper surface of the wafer such that a thin layer of the insulating material extends across the upper surface of the wafer.

In one embodiment of the invention, the insulating material is oxide.

In another embodiment of the invention, the material in which it is desired to form uniformly-sized features is polysilicon.

In another embodiment of the invention, the material in which it is desired to form uniformly-sized features is aluminum.

In another embodiment of the invention, source/drain diffusion regions are defined within the active areas to act as sources and drains of MOS transistors to be formed with the active areas, where at least some of the uniformly-sized features form gate electrodes for the MOS transistors.

Other objects, features and advantages of the invention will become apparent in light of the following description thereof.

DETAILED DESCRIPTION OF THE INVENTION

The present inventive technique provides for formation of "regular" or evenly sized features in a layer of a semiconductor device. In an exemplary embodiment of the invention, the features sought to be formed with substantially uniform size are conductive lines over active areas on a semiconductor wafer by forming isolation "trenches" around the active areas, filling the trenches with oxide (or other suitable insulating material) then polishing back the oxide until a substantially planar surface is formed with the surface of the wafer. Alternatively, the insulating material may be polished back to a planar surface slightly above the original surface of the wafer to form a thin oxide layer over the active areas between the isolation trenches to act as, for example, a thin gate oxide insulating layer for MOS transistors. Such techniques for filling trenches and planarizing are known in the art. One suitable technique for accomplishing this is described in U.S. Pat. No. 5,006,482, issued Apr. 9, 1991 to Kerbaugh et al., incorporated herein by reference. Other similar known techniques involve various combinations of chemical etching and chemical/mechanical.

Figure 2C:
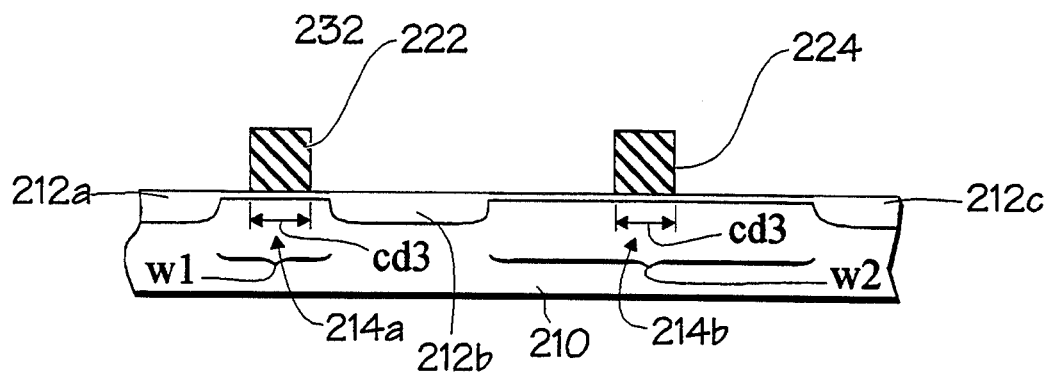
FIGS. 2a–2c are cross-sectional views of a semiconductor wafer at various stages of processing, according to the present invention.
Figure 1C:
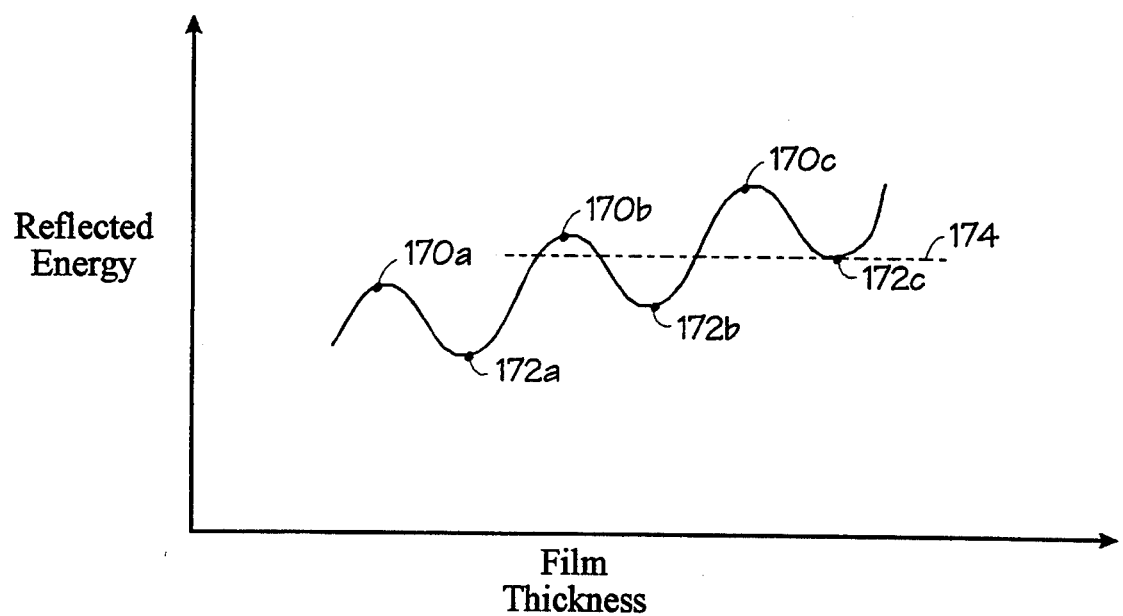
FIG. 1c is a graph of reflected energy versus film thickness for a film layer of photoresist.
Figure 2A:
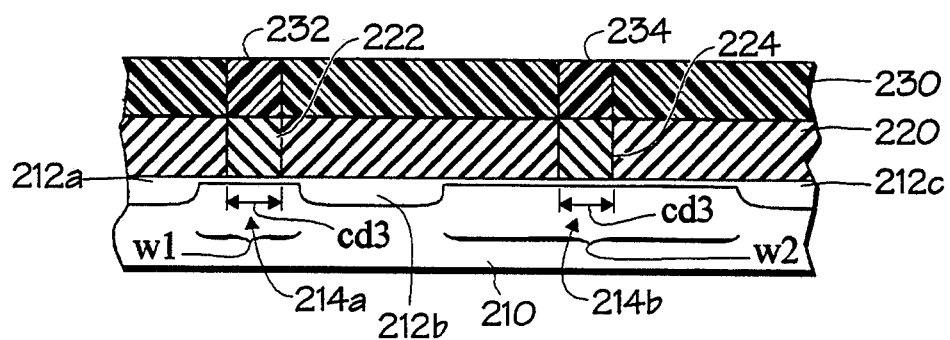
Figure 2B:
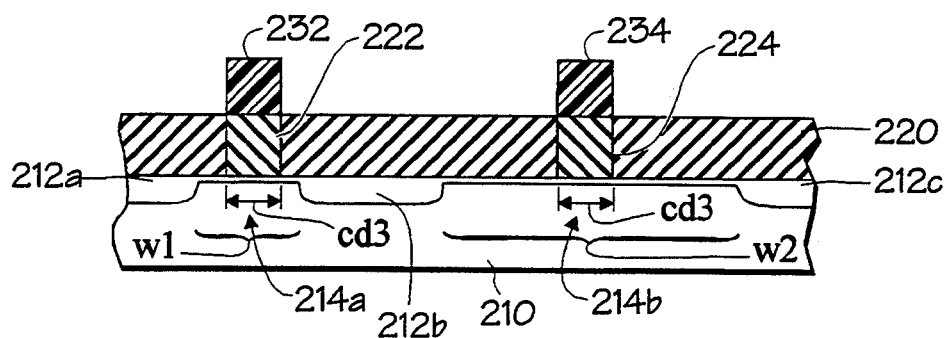

On top of the planarized surface, a substantially planar layer of conductive material, preferably polysilicon, is formed. A substantially planar layer of photoresist is formed over the substantially planar layer of conductive material. The photoresist layer, being planar and being formed over a planar surface, has minimal variation in thickness from point-to-point and therefore has minimal variation in reflectivity. As a result, exposure of the photoresist to radiant energy (e.g., light) patterns defining features of uniform size, either through a mask or by other suitable means, will result in uniformly-sized (in both height and width) sensitized areas in the photoresist layer corresponding to those features, regardless of the spacing of the features or their relationship to underlying structures. The areas of the photoresist layer which are not sensitized are then chemically stripped to expose portions of the underlying layer of conductive material. Next, the exposed areas of the conductive material are etched (removed). Those areas of the conductive material which remain covered by the photoresist are substantially unaffected. After etching, uniformly sized patterns (e.g., lines) of conductive material remain. Since the width of the photoresist patterns is uniform, the width of the resultant conductive patterns is also uniform. Further, since the conductive material was formed in a planar layer, the height of the conductive patterns is also uniform. FIGS. 2a-2c illustrate this process.

Figure 1A:
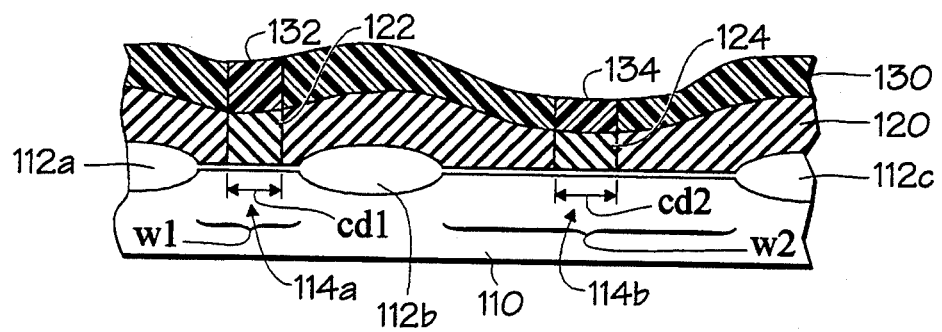
FIG. 1a is a cross-sectional view of a semiconductor wafer formed by techniques typical of the prior art.
Figure 1B:
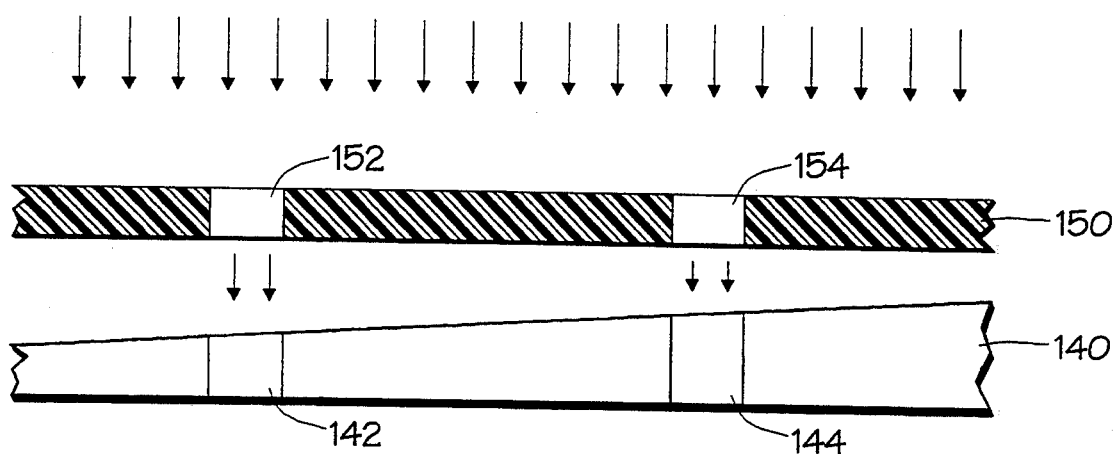
FIG. 1b is a cross-sectional view of a photoresist layer being exposed to light through a mask.

FIG. 2A shows a cross-sectional view of a portion of a semiconductor wafer 210, similar to the view shown in FIG. 1a, except that rather than developing thermally grown raised structures (e.g., 112a, 112b and 112c, FIG. 1a) of Field Oxide (FOX), planar FOX structures 212a, 212b, and 212c are formed (i.e. planar with the surface of the wafer) between which are active areas (islands) 214a and 214b having an equal elevation (e.g., at wafer level). As described hereinabove, this is accomplished by forming trenches on either side of the active areas, overfilling the trenches with an insulator, preferably oxide, and chemically and/or mechanically planarizing the oxide to an elevation either flush with the wafer surface or slightly above the original wafer surface. (FIG. 2a shows the oxide planarized to a level slightly above the original surface of the wafer such that a thin layer of oxide extends over the active areas 214a and 214b.) Similar to the view shown in FIG. 1a, the island 214a (see 114a) between the FOX structures 212a and 212b (see 112a and 112b) has a width w1 substantially smaller than the width w2 of the island 214b between the FOX structures 212b and 212c. As described hereinabove with respect to FIG. 1a, having islands of different widths is not uncommon.

An overlying layer planar layer 220 of a conductive material, (e.g., polysilicon or "poly") is deposited over the wafer, which, in contrast to the view of FIG. 1a, exhibits a planar topography. Because the conductive material 220 is formed as a planar layer over an already planar surface, the thickness (height) of the conductive material is essentially uniform from point-to-point across the wafer.

An overlying planar film (layer) 230 of photoresist is applied, in any suitable manner, over the conductive layer 220, and photolithographically treated to created etch-resistant "lines" (photochemically-converted areas) 232 and 234 over the active areas 214a and 214b, respectively. The line features 232 and 234 are shown in reverse cross-hatch from the remainder of the film 230. Since the film layer of photoresist 230 is itself planar and overlies a planar surface (i.e., the conductive material 220), the thickness of the photoresist 230 is essentially uniform from point-to-point across the wafer. As a result, reflectivity of the photoresist 230 is also effectively uniform from point-to-point across the wafer.

Ultimately, as shown in FIG. 2B, the photoresist layer 230 is etched (or washed) away, leaving only a pattern of photochemically-converted areas 232 and 234 overlying the conductive material 220. As a result of the uniform thickness and reflectivity of the photoresist layer 230, the photochemically-converted areas 232 and 234 are uniformly sized (assuming that they exposed to uniformly sized patterns in the photolithographic process), corresponding to desired features 222 and 224 having substantially identical critical dimensions "cd3".

In subsequent fabrication steps, the wafer is etched (chemical, plasma, etc.), so that all but discrete conductive regions 222 and 224 (shown in reverse cross-hatch) underlying respective photoresist features 232 and 234, respectively, are removed from the surface of the wafer. This is shown in FIG. 2C. With additional processing, not shown, remaining portions of MOS devices may be formed, for which the conductive regions 222 and 224 serve as gates (gate electrodes).

The inventive technique may be applied at any of various processing steps during the fabrication of an integrated circuit. As stated hereinabove, the inventive technique is particularly useful is forming polysilicon gates for MOS devices (transistors). In this case, the conductive material is polysilicon, and the active areas are appropriately doped to form p-tubs and/or n-tubs (source/drain diffusion regions) which serve as sources and drains of such transistors. The polysilicon conductive "lines" may be used as gates and/or as interconnecting lines between devices.

The inventive technique may also be used to advantage at any processing step where LOCOS (Local Oxidation of Silicon, a known technique for thermally growing oxide isolation structures) is presently used to grow oxide after which conductive lines (e.g., aluminum) are deposited. In this case, the LOCOS step is eliminated and replaced with the technique described hereinabove whereby trenches are formed, filled with oxide and planarized, a planar layer of conductive material is formed and a planar layer of photoresist is formed. This may be used to great advantage in forming uniformly sized metal or poly interconnections in multi-layer semiconductor devices (integrated circuits). A primary advantage of uniformly sized conductors is predictable delay performance, as it is for uniformly sized gate structures.

It is within the scope of this invention that the layer in which it is sought to form substantially uniform size features is not initially planar. In such a case, the layer would be applied, then planarized (such as by chemical-mechanical polishing). The overlying layer (e.g., photoresist) will then be applied in a planar manner to a uniform thickness, or caused to exhibit a uniform thickness (e.g., such as by chemical-mechanical polishing). The resultant uniform thickness of the overlying photoresist layer will exhibit substantially uniform reflectivity, so that the features formed in the underlying layer will exhibit substantially uniform "cd" (width).

Other embodiments of forming a substantially uniform thickness "sacrificial" layer (e.g., photoresist) over an underlying layer (e.g., polysilicon, aluminum, etc.) which is planar (or which has been planarized), in order to enhance the size uniformity of features (e.g., poly gates or lines, metal lines, etc) formed in the underlying layer are within the scope of this invention.

What is claimed is:

1. Method of forming uniform dimension features in a layer of a semiconductor wafer comprising:
   providing a semiconductor wafer having a substantially planar top surface;
   forming trenches into the top surface of the wafer;
   overfilling the trenches with an insulating material such that the trenches are completely filled and the entire upper surface of the wafer is covered with the insulating material;
   removing excess insulating material so that the insulating material has a substantially planar upper surface;
   disposing a feature layer of conductive material in which features are desired to be formed over the insulating material;
   forming a substantially-uniform thickness photoresist layer over the feature layer;
   processing selected areas of the photoresist layer so that the selected areas of the photoresist layer are etch-resistant;
   removing all but the selected areas of the photoresist layer so that selected areas of the feature layer are directly underlying the selected areas of the photoresist layer and remaining portions of the feature layer are exposed; and
   etching the exposed portions of the feature layer of conductive material such that after etching, the selected areas of the feature layer have substantially uniform dimension.

2. A method according to claim 1, wherein:
   the etching of the exposed portions of the feature layer is performed by a plasma etching process.

3. A method according to claim 1, wherein:
   the etching of the exposed portions of the feature layer is performed by a chemical etching process.

4. A method according to claim 1, wherein:
   the insulating material is polished back such that the trenches are filled to a level substantially flush with the upper surface of the wafer.

5. A method according to claim 1, wherein:
   the insulating material is polished back to a planar surface at a level above the upper surface of the wafer such that a thin layer of the insulating material extends across the upper surface of the wafer.

6. A method according to claim 1, wherein:
   the insulating material is formed of oxide.

7. A method according to claim 1, wherein:
   the feature layer is formed of polysilicon.

8. A method according to claim 7, wherein:
   the features are polysilicon gate electrodes.

9. A method according to claim 1, wherein:
   the feature layer is formed of aluminum.

10. A method according to claim 1, wherein:
    the processing of selected areas of the photoresist layer is performed photolithographically.

11. A method according to claim 1, wherein:
    source and drain regions are defined between the filled trenches; and
    at least some of the features of the feature layer are gate electrodes.

12. A method according to claim 11, wherein:
    the insulating material is formed of oxide.

13. A method according to claim 11, wherein:
    the feature layer is formed of polysilicon.

14. Method of forming conductive features having a uniform dimension in a layer of a semiconductor wafer, comprising:
    forming trenches in a semiconductor wafer and filling the trenches with an insulating material having a substantially planar top surface;
    disposing a layer of conductive material over the insulating material;
    disposing a substantially-uniform thickness layer of photoresist over the layer of conductive material;
    removing all but selected areas of the photoresist to expose all but corresponding selected areas of the layer of conductive material; and
    etching the conductive layer so that the corresponding selected areas of the conductive layer have a substantially uniform dimension 15. A method, according to claim 14, wherein:
    the conductive material is polysilicon.

16. A method, according to claim 15, wherein:
    the corresponding selected areas of the conductive layer are polysilicon gate electrodes.

17. A method according to claim 14, wherein:
    the conductive material is aluminum.

18. A method according to claim 14, wherein:
    the conductive layer is etched by plasma etching.

19. A method according to claim 14, wherein:
    the conductive layer is etched by chemical etching.

20. A method according to claim 14, wherein:
    the insulating material is oxide.

* * * * *